United States Patent
Lee et al.

(10) Patent No.: US 7,667,401 B2
(45) Date of Patent: Feb. 23, 2010

(54) PDP FILTER AND MANUFACTURING METHOD THEREOF USING A FULLY ETCHED ELECTROMAGNETIC INTERFERENCE FILM

(75) Inventors: Dong-wook Lee, Daejeon (KR); Yeon-keun Lee, Deajeon (KR); In-seok Hwang, Daejeon (KR); Seung-wook Kim, Incheon (KR)

(73) Assignee: LG Chem, Ltd., Seoul (KR)

( * ) Notice: Subject to any disclaimer, the term of this patent is extended or adjusted under 35 U.S.C. 154(b) by 405 days.

(21) Appl. No.: 11/435,290

(22) Filed: May 17, 2006

(65) Prior Publication Data

US 2006/0280916 A1 Dec. 14, 2006

(30) Foreign Application Priority Data

Jun. 9, 2005 (KR) .................. 10-2005-0049326

(51) Int. Cl.
*H01J 17/49* (2006.01)
(52) U.S. Cl. ...................... 313/582; 313/584
(58) Field of Classification Search .......... 313/582–584
See application file for complete search history.

(56) References Cited

FOREIGN PATENT DOCUMENTS

| EP | 1180 781 | A2 | 2/2002 |
|---|---|---|---|
| EP | 1180 781 | A3 | 9/2002 |
| EP | 167 318 | A1 | 12/2002 |
| EP | 1316983 | A2 | 6/2003 |
| EP | 1316983 | A3 | 4/2005 |
| JP | 2000-332486 | | 11/2000 |
| JP | 2001-217589 | | 8/2001 |
| JP | 2005-072472 | | 3/2005 |

*Primary Examiner*—Vip Patel
(74) *Attorney, Agent, or Firm*—McKenna Long & Aldridge, LLP

(57) ABSTRACT

The present invention relates to a PDP filter and a manufacturing method thereof using a fully etched electromagnetic interference film, and more particularly, to a PDP filter and a manufacturing method thereof in which the separation between an etching portion and a non-etching portion is removed by etching an entire surface of electromagnetic interference film that has been used by selectively etching a predetermined region on a surface to form an effective screen portion (etching portion) separately from a ground portion (non-etching portion), and when an electromagnetic interference film roll having such a structure is cut into a small size in a winding direction of the roller only it can be laminated with other functional films by a roll-to-roll process so as to make it applicable when required by cutting it into a desired size even though the effective size of a PDP is changed.

4 Claims, 10 Drawing Sheets

PDP FILTER AND MANUFACTURING METHOD THEREOF USING A FULLY ETCHED ELECTROMAGNETIC INTERFERENCE FILM

This application claims the benefit of the filing date of Korean Patent Application No. 10-2005-0049326 filed on Jun. 9, 2005 in the Korean Intellectual Property Office, the disclosure of which is incorporated herein its entirety by reference.

TECHNICAL FIELD

The present invention relates to a PDP filter and a manufacturing method thereof using a fully etched electromagnetic interference film, and more particularly, to a PDP filter and a manufacturing method thereof in which the separation between an etching portion and a non-etching portion is removed by etching an entire surface of electromagnetic interference film that has been used by selectively etching a predetermined region on a surface to form an effective screen portion (etching portion) separately from a ground portion (non-etching portion), and when an electromagnetic interference film roll having such a structure is cut into a small size in a winding direction of the roller only it can be laminated with other functional films by a roll-to-roll process so as to make it applicable when required by cutting it into a desired size even though the effective size of a PDP is changed.

BACKGROUND ART

Generally, a plasma display panel (hereinafter referred to as "PDP") is a device for displaying an image including character and graphic information by emitting a fluorescent material using 147 nm ultraviolet ray which is generated at the time of discharging an inert mixing gas such as He+Xe, Ne+Xe, He+Ne+Xe, or the like, and has attracted public attention as a representative flat panel display device along with an LCD panel owing to its advantages such as natural color representation by the use of spontaneous emission, securing a wide viewing angle of 160 degrees or greater, and large screen display capability.

Such a PDP display is a device for emitting spontaneously using a discharge phenomenon in a discharge cell, and requires very high power consumption compared to the existing CRT display device, thus it has a problem in which electromagnetic emission, near infrared ray noise signal, and the like generated from the inside of a set are measured remarkably higher than those of a CRT display.

In order to solve those problems, a PDP display is provided with a PDP filter on a front surface of the module to perform a reflection preventing function, an electromagnetic interference emission shielding function, a near infrared absorption function, a color calibration function, and the like. In particular, if the PDP display is to be used at home, the electromagnetic interference standard Class B should be satisfied. In order to satisfy this requirement, an etching mesh-type electromagnetic interference film (hereinafter referred to as "EMI film") or an evaporated EMI film by sputtering is used as an electromagnetic interference film to form a part of the PDP filter.

Such an electromagnetic interference film should be grounded to the PDP to obtain an effect of shielding electromagnetic waves. When producing an EMI film, in order to enhance the efficiency of the ground, a grid pattern for the effective screen portion is formed by etching as illustrated in FIG. 1, and the non-etching portion at the four side edges remains in a non-etched state, and the ground portion as the non-etching portion comes into contact with a ground implement of the PDP to make the ground.

On the other hand, in most PDP filters, an EMI film is positioned inside the outermost portion of a product, it is because that an image cannot be seen clearly due to the fact that the surface of an etched region is not so slick. In order to remove the problem, it is subjected to a transparency process for adhering other functional films on the EMI film to make the surface to be slick. For a functional film used in the transparency process, anti-reflective film, near infrared ray shielding film, ultraviolet ray shielding film, color correction film, or the like can be used.

In such a configuration with the effective screen portion and the ground portion, the size of an effective screen portion has to be changed whenever the screen size of the PDP is changed, thus it causes troublesomeness that its pattern should be reproduced every time. As stated above, functional films adhered to the EMI film are produced by a manufacturing method in which they are cut smaller than a EMI film and adhered to one another in a sheet state one by one since the four sides of the EMI film are all exposed to the outside and adhered to make the ground. There is a problem that all the functional films cannot be laminated by a roll-to-roll method, and this is a root cause for reducing the productivity of a PDP filter.

DISCLOSURE OF THE INVENTION

The present invention is worked out in order to solve the foregoing problems. Therefore, when producing a PDP filter, it is an object of the present invention to improve a conventional sheet lamination process in which it is produced by cutting a functional film smaller than a EMI film to attach to each other in a sheet state one by one thereby allowing a roll-to-roll process to be applied so as to improve the productivity of producing a PDP filter.

Furthermore, it is another object of the invention to solve a conventional problem in which an EMI film should be separately produced according to the effective screen portion size of a PDP, thereby making it applicable when required by cutting the EMI film into a desired size even though the effective screen size of a PDP is changed.

In order to achieve the foregoing objects, in a PDP filter which is formed by laminating an electromagnetic interference film and at least one of other functional films, the present invention provides a fully etched electromagnetic interference film in which the electromagnetic interference film is etched on its entire surface so as to expand the region made of an effective screen portion into its entire surface on the electromagnetic interference film.

Preferably, a width of the functional film is formed less than that of the electromagnetic interference film such that both the top and bottom sides of the electromagnetic interference film are exposed to the outside to make the ground, and a conductive tape adhesion or conductive paste coating for the ground can be implemented at both the left and right sides where the electromagnetic interference film is not exposed to the outside. Moreover, a conductive tape adhesion or conductive paste coating can be implemented not only at both the left and right sides where the electromagnetic interference film is not exposed to the outside but also at both the top and bottom sides where the electromagnetic interference film is exposed to the outside to make the ground more amicably. For the functional film, at least one or more of anti-reflective film, near infrared ray shielding film, ultraviolet ray shielding film, color correction film, impact absorption film, glare-proof film, and noise absorption film is laminated.

Furthermore, a method of manufacturing a PDP filter provided according to the present invention includes a step of preparing a fully etched electromagnetic interference film in a roll shape to mount a winding roll of the electromagnetic interference film on a first feed roller; a step of preparing a functional film having a smaller width than that of the electromagnetic interference film to mount on a second feed roller arranged at a predetermined distance from the first feed roller; a step of installing a first compression roller and a second compression roller provided in a shape of closely facing to each other at a predetermined distance from the first feed roller and the second feed roller, and then passing an electromagnetic interference film roll supplied from the first feed roller and a functional film roll supplied from the second feed roller through between the first compression roller and the second compression roller and adhering to one another by heat and pressure to be integrated, thereby producing a PDP filter roll in such a manner that both the top and bottom sides of the electromagnetic interference film are exposed to the outside; and a step of cutting the integrated PDP filter roll into a predetermined size of PDP filter. Moreover, it further includes a step of adhering the functional film to the electromagnetic interference film, and then placing the adhered PDP filter roll into an autoclave to enhance adhesion, and further includes a step of performing a conductive tape adhesion or a step of performing a conductive paste coating for the ground not only on both the left and right sides where the electromagnetic interference film is not exposed to the outside but also on both the top and bottom sides where the electromagnetic interference film is exposed to the outside.

BRIEF DESCRIPTION OF THE DRAWINGS

The above objects, other features and advantages of the present invention will become more apparent by describing the preferred embodiment thereof with reference to the accompanying drawings, in which.

BEST MODE FOR CARRYING OUT THE INVENTION

Reference will now be made in detail to a preferred embodiment of the present invention, examples of which are illustrated in the accompanying drawings.

Figure 3:
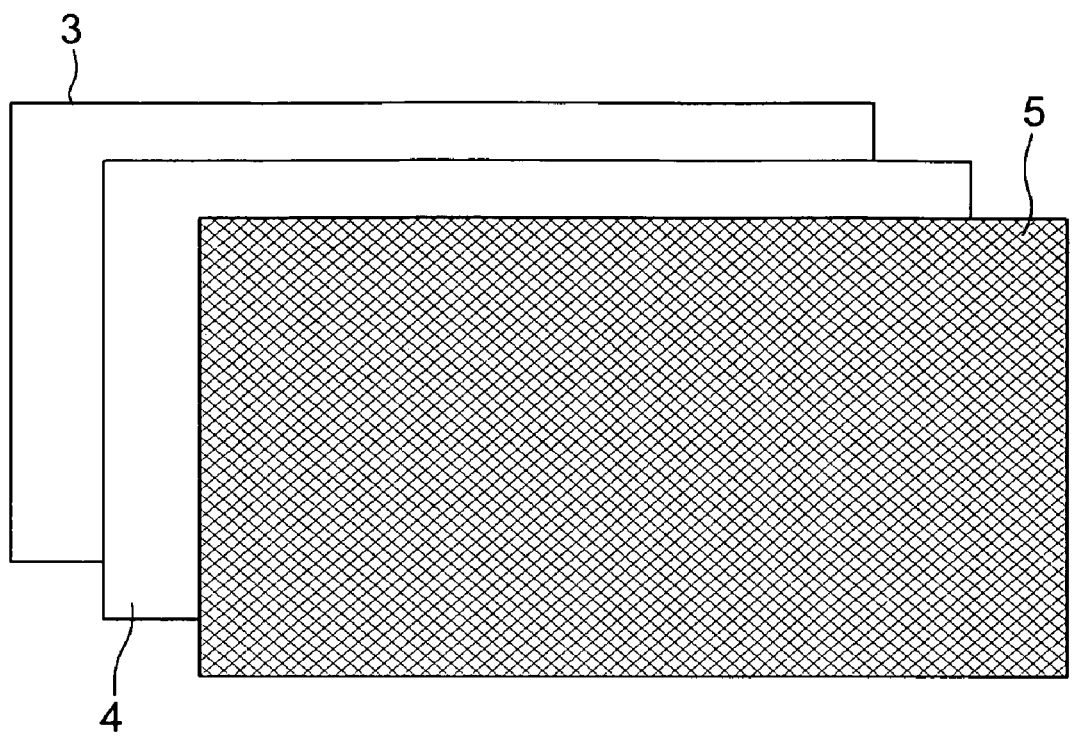
FIG. 3 is a plan view illustrating a fully etched electromagnetic interference film according to the present invention.

FIG. 3 is a plan view illustrating a fully etched electromagnetic interference film according to the present invention. An electromagnetic interference film 100 according to the present is prepared by coating an adhesive agent 4 on the upper surface of a transparent substrate 3 and adhering a conductive metal thin film 5 to the transparent substrate 3 by pressure through the adhesive agent 4. For the electromagnetic interference film 100 adhered by pressure, the separation between an effective screen portion 1 and a ground portion 2 is removed in which a mesh-type metal film has been divided into the etching portion and the non-etching portion by a photolithography and etching process after a photosensitive film is formed on the upper surface, and an effective portion by the etching portion is formed on its entire surface.

More specifically, the transparent substrate 3 of the electromagnetic interference film 100 for a display functions to support the metal thin film 5. In terms of use, it should have an excellent transparency for visible light, and good chemical resistance and handling capability against a wet etching process. For this purpose, as the transparent substrate 3, a polyester group, such as polyethylene terephthalate, poly ethylene naphthalate, a polyolefin group, such as ethyl vinyl acetate, polypropylene, polystyrene, a vinyl group, such as polyvinyl chloride, polyvinylidene chloride, and a polymer film and resin, such as polycarbonate, acrylic resin, triacetyl cellulose, polyimide can be used. Furthermore, it is preferable that the transparent substrate 3 is 10~250 μm thick.

For the conductive metal thin film 5 functioning to shield electromagnetic waves, a thin film such as copper, iron, nickel, aluminum, gold, silver, platinum, etc. is solely used, or an alloy foil having two or more kinds such as copper-nickel alloy, stainless, and the like is used. From a aspect of the surface resistance value of the metal thin film 5 which is a key parameter for determining the efficiency of shielding electromagnetic waves, the level of implementing a fine pattern on the metal thin film 5, and the viewing angle of a display, it is preferable that the metal thin film 5 is 5~20 μm thick. In case where the thickness of the metal thin film 5 is less than 5 μm, the surface resistance value of the metal thin film 5 is generally high thereby reducing the efficiency of shielding electromagnetic waves, and in case where the thickness of the metal thin film 5 is greater than 20 μm, it may cause problems that it is difficult to implement the line width of a fine mesh on the metal thin film 5, and becomes difficult to obtain high aperture ratio and high visibility, and the viewing angle of a display becomes narrower.

The adhesive agent 4 for adhering the transparent substrate 3 to the metal thin film 5 should have transparency, and the refractive index of the adhesive agent 4 should be same as that of the transparent substrate 3 not to reduce the transmittance ratio of visible light, and it is preferable to use a resin having the property that causes a physicochemical change by external energy sources such as heat and pressure or ultraviolet ray (UV). As this adhesive agent 4, a single or at least two kinds of mixture of acryl group, urethane group, polyester group and epoxy group resins, or their metamorphic resins can be used.

The transparent substrate 3 adhered by the metal thin film 5 is subjected to a cleaning process, and then a photosensitive film (not shown) is formed on the upper surface of the metal thin film 5, and a photoresist solution and a photoresist film can be used as the photosensitive film. The photoresist solution is coated onto the metal thin film 5 with deposition, spraying, and spin coating methods, and there are a negative photoresist solution such as casein, polyvinyl alcohol, poly methacrylic acid methyl, etc., and a positive photoresist solution of the azide series. Furthermore, a dry film resist (DFR) is used as the photosensitive film, and the dry film resist is adhered to the metal thin film preheated at 60~100° C. to improve the cohesive power of the metal thin film 5.

Such a metal thin film 5 formed with the photosensitive film is etched by a photolithography and etching process to form a mesh-type metal thin film 5. The mesh-type metal thin film 5 is formed by placing a photomask formed with a pattern corresponding to a mesh structure to be formed on the metal thin film 5 on the upper surface of the photosensitive film to expose the photosensitive film by irradiating a light, and by developing a portion other than the portion of the photosensitive film cured by the light with a developer, and by etching the metal thin film 5 exposed to the outside of the photosensitive film. The electromagnetic interference film 100 provided by this invention is etched on its entire surface, and the effective screen portion 1 is formed on the whole entire surface as illustrated in FIG. 3.

Figure 4:
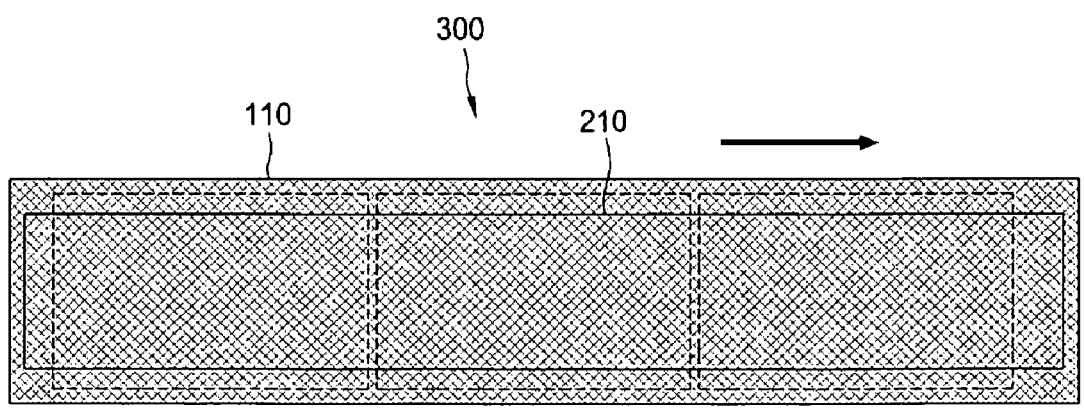
FIG. 4 is a plan perspective view illustrating a roll plane of a PDP filter produced by a manufacturing method according to the present invention.
Figure 5:
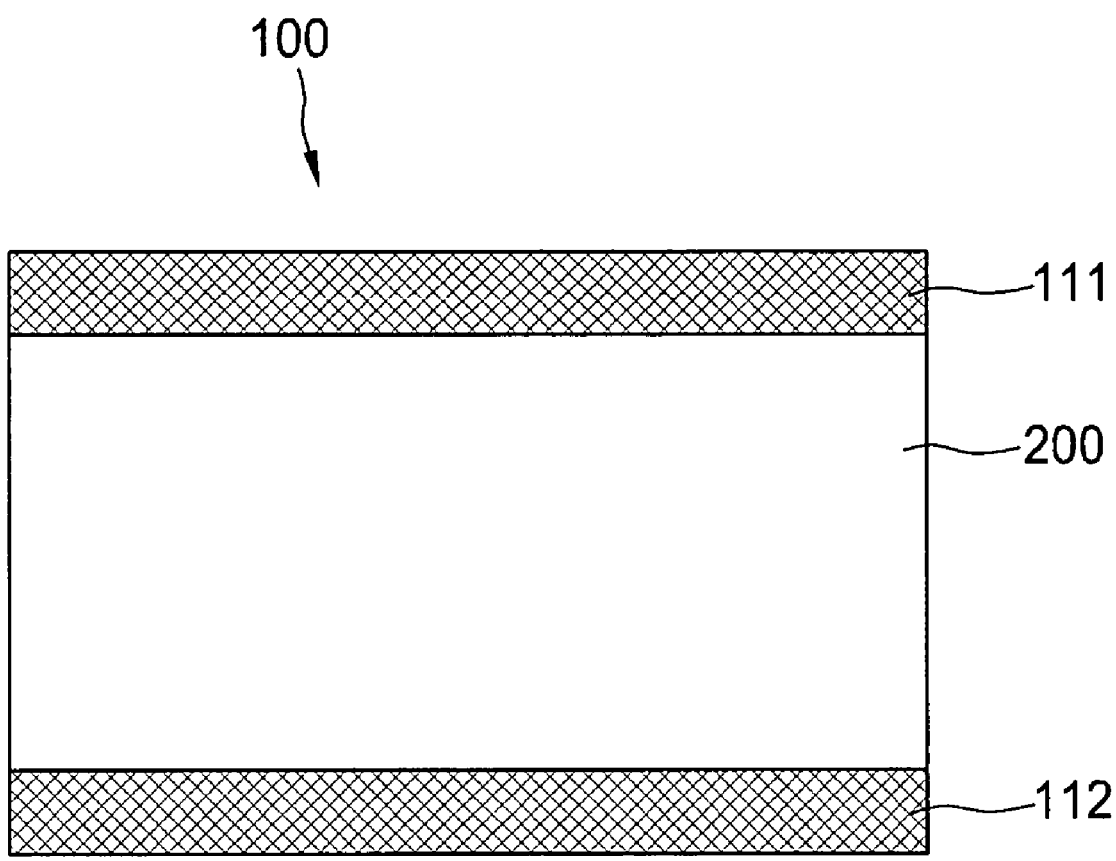
FIG. 5 is a plan view illustrating a state that a PDP filter according to the present invention is cut into a predetermined length.

FIG. 4 illustrates a functional film roll 210 having a width smaller than that of the electromagnetic interference film 100 is adhered in a longitudinal direction on a roll 110 of the electromagnetic interference film 100 as illustrated in FIG. 3, and it illustrates a roll state prior to being completed as a PDP filter after it is cut into a predetermined size and then cut as illustrated in FIG. 5.

According to FIG. 4, when the winding direction of a roll shown as an arrow is a longitudinal direction, it is illustrated that other functional films 210 attached to the upper side of the electromagnetic interference film roll 110 are slit in such a manner that their size in a width direction are smaller than that of the electromagnetic interference film roll 110 in a width direction, and laminated using a roll-to-roll process to form a PDP filter roll 300.

Figure 6:
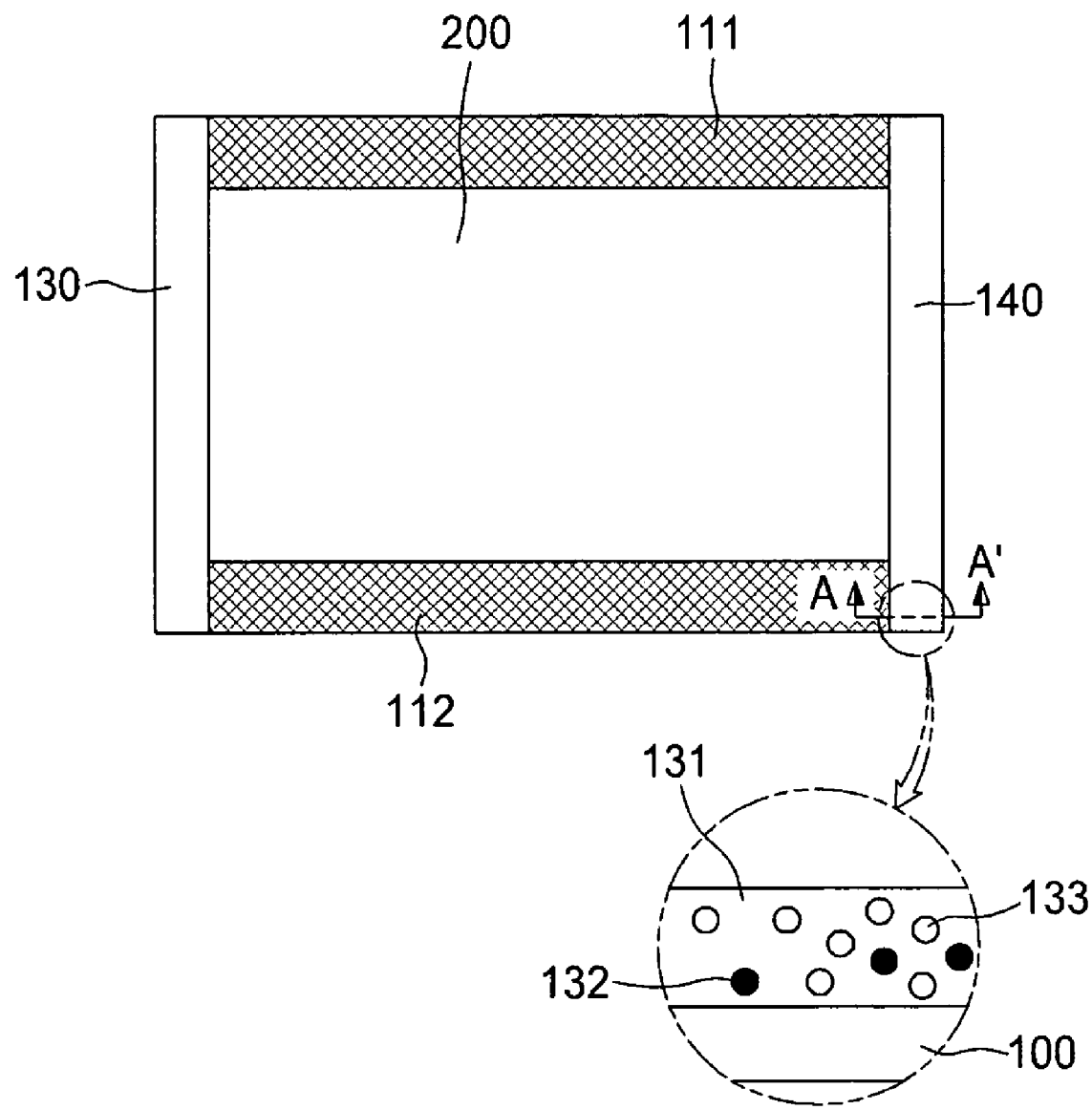
FIG. 6 is a plan view illustrating a state that a conductive tape is adhered to a PDP filter according to the present invention.
Figure 7:
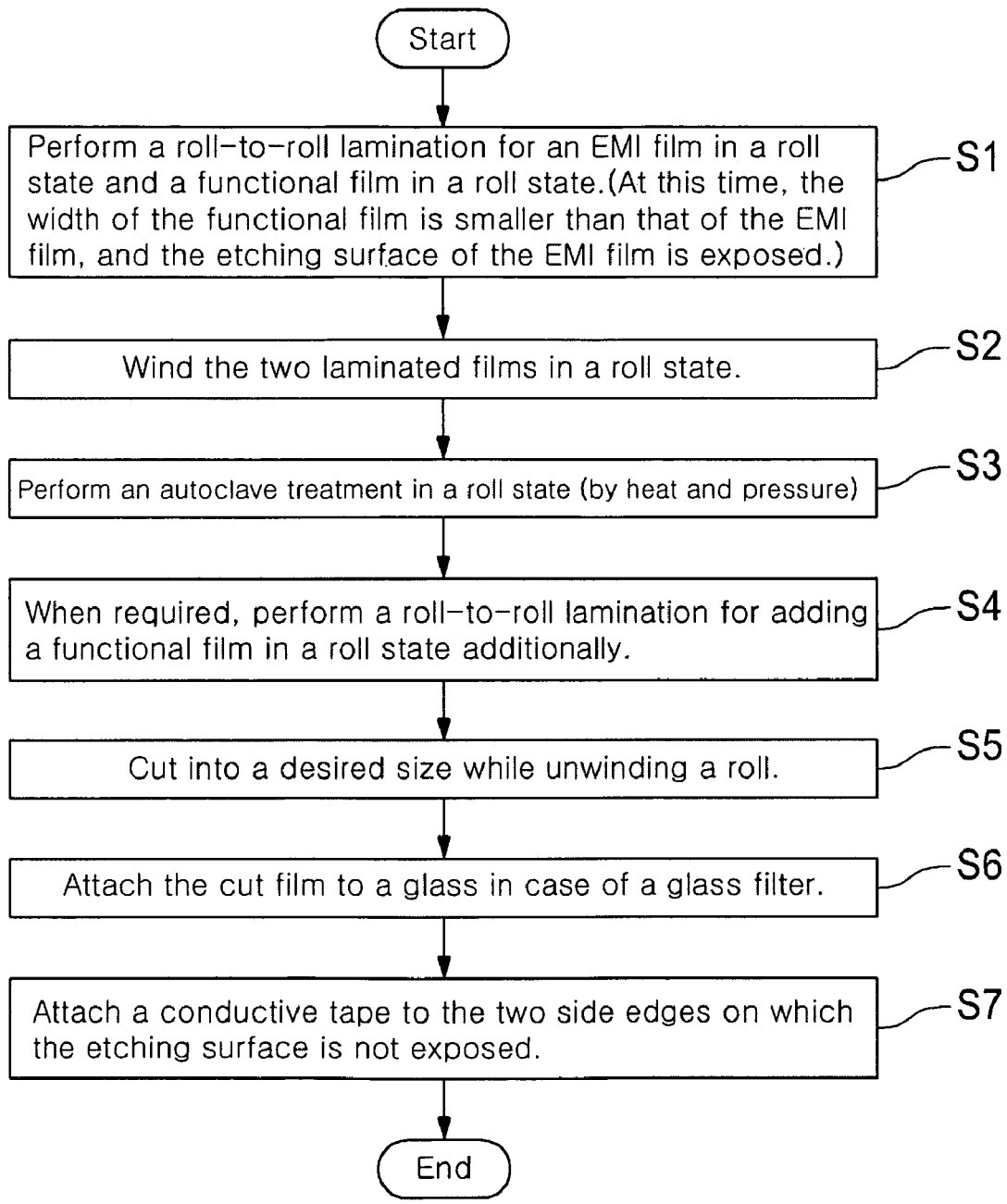
FIG. 7 is a flow chart illustrating a manufacturing method according to the present invention.

A method of producing a PDP filter roll 300 as illustrated in FIG. 4 is partly described by S1 and S2 as disclosed in a flowchart of FIG. 7. Hereinafter, all the operations will be described as a whole in which the PDP filter roll 300 of FIG. 4 is cut into a predetermined size at S5 of FIG. 7 as illustrated in FIG. 5, and conductive tapes 130 and 140 are adhered to the PDP filter 100 of FIG. 5 at S7 as illustrated in FIG. 6.

First, at S1, a fully etched electromagnetic interference film 100 is prepared in the shape of a roll 110 and a winding roll of the electromagnetic interference film is mounted on a first feed roller, and a functional film 200 having the width smaller than that of the electromagnetic interference film roll 110 is prepared in the shape of a roll 210 and mounted on a second feed roller arranged at a predetermined distance from the first feed roller in order to implement a roll-to-roll lamination process.

At this time, it is intentionally designed that the width of the functional film roll 210 is smaller than that of the electromagnetic interference film roll 110 so that after being cut into a predetermined size as illustrated in FIG. 5, a part of an etched surface of the electromagnetic interference film 100, more specifically, an top long side 111 and a bottom long side 112 of the electromagnetic interference film roll 110 can be exposed to the outside. (However, both the top and bottom sides can become short sides and both the left and right sides can become long sides according to the cut size.)

It is intentionally designed to achieve an object to produce the PDP film 100 by a roll-to-roll lamination process thereby improving the productivity as well as making the ground by the portion that is partly exposed to the outside as in the prior art.

Furthermore, the PDP filter roll 300 laminated through the operation S1 is wound in a roll state at S2, and the PDP filter roll 300 in a roll state is autoclaved by heat and pressure at S3, and when required a roll-to-roll lamination process for additionally adding another functional film in a roll state can be implemented at S4. Here, S4 is a process that can be omitted or additionally reiterated whenever required.

Subsequently, a roll wound at S2 or S4 is cut into a desired size while being unwound at S5, and at this time a state of being cut into a predetermined size is illustrated in FIG. 5.

Subsequent to the operation of cutting at S5, the operation S6 of adhering the cut film on a PDP module (not shown) or a glass to produce a glass filter, or the operation S7 of adhering a conductive tape as illustrated in S7 to both the left and right short side edges 130 and 140 on which the etching surface is not exposed so as not to be grounded as illustrated FIG. 5. Here, at S6 and S7, the sequence can be exchanged when required, and the operation of adhering a conductive tape at S7 can be replaced with the operation of coating a conductive paste.

Furthermore, for the electromagnetic interference film to be amicably grounded, not only both the left and right short sides 130 and 140 but also both the top and bottom long sides 111 and 112 can be coated with a conductive tape or conductive paste.

At this time, as illustrated at the cross section of A-A', the conductive tape is generally composed of polymer adhesive resin 131, conductive powder 132, and polymer filler 133; and the polymer adhesive resin 131 is composed of thermosetting resin, thermoplastic resin, curing initiating agent, stabilizer, etc.; and epoxy resin, melamine resin, polyurethane resin, polyimide resin, polyethylene resin, poly propylene resin, natural rubber, etc. can be used as the thermoplastic resin; and aliphatic amines, aromatic amines, amides, acid anhydrides, phenolics, imidazole derivatives, etc. can be used as a hardener of the thermosetting resin. Furthermore, the conductive powder 132 is dispersed into a plurality inside the polymer adhesive resin 131; and metal coating polymer, nickel, gold, copper, tin, lead, etc. can be used as the conductive powder 132 with a single or alloy; and it can be used by coating an insulating resin in addition to this.

The polymer filler 133 is dispersed into a plurality inside the polymer adhesive resin 131 like the conductive powder 132, and the polymer filler 133 is a polymer composed in such a manner that the coefficient of elasticity be less than or equal to that of the conductive powder 132, and a polystyrene (PS) resin or polyethylene (PE) resin is used. It is preferable that the number of polymer fillers 133 is distributed within 2~5 times compared to the number of the conductive powders 132. In case where the number of polymer fillers 133 exceeds five times the number of the conductive powders 132, the pressure and adhesive force can be lowered when bonded.

Hereinafter, an experimental example according to the present invention will be described in detail. Needless to say, the scope of the invention is not limited to the following experimental example.

EXPERIMENTAL EXAMPLE

1. Manufacture of an Electromagnetic Interference Film

A 15-µm thick adhesive was coated on the upper surface of a 100-µm thick PET transparent substrate, and then a 10-µm thick copper thin film was compressed on the upper surface of the transparent substrate, and it was dried and washed. Thereafter, a photoresist solution was coated on the upper surface of the copper film using a roll coating method.

Subsequently, using a photomask on which a pattern was formed by a laser, it was exposed by a photolithographic method, and then developed to form a mesh-type metal thin film.

2. Manufacture of a PDP Filter on Which a Functional Film is Adhered

A roll wound with the produced electromagnetic interference film (width: 600 mm) was mounted on the feed roller and an anti-reflection film (width: 560 mm) was mounted on the second feed roller, and then it was laminated using a roll-to-roll process while the top and bottom sides 20 mm of the electromagnetic interference film was exposed to produce a PDP filter, and then it was wound in a roll state. The produced PDP filter roll was autoclaved at 60° C., 0.5 MPa, and then it was cut to be 1000 mm.

Figure 8A:
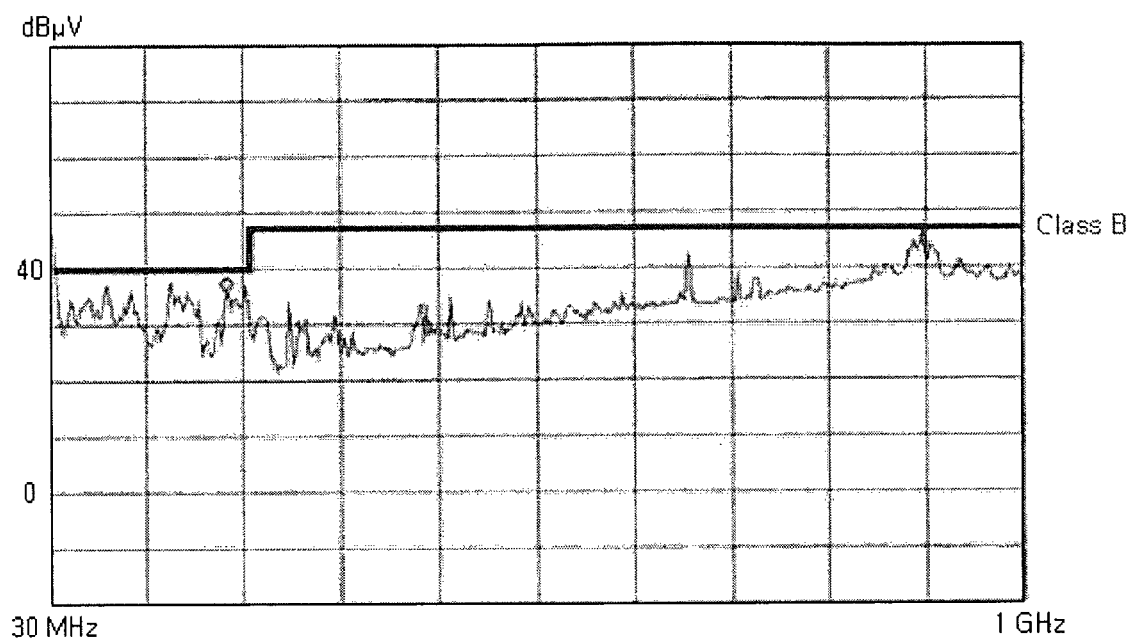
FIG. 8a is a graph illustrating an electromagnetic interference emission measured in the vertical direction in case where a PDP filter produced according to the present invention is mounted on a PDP module.
Figure 8B:
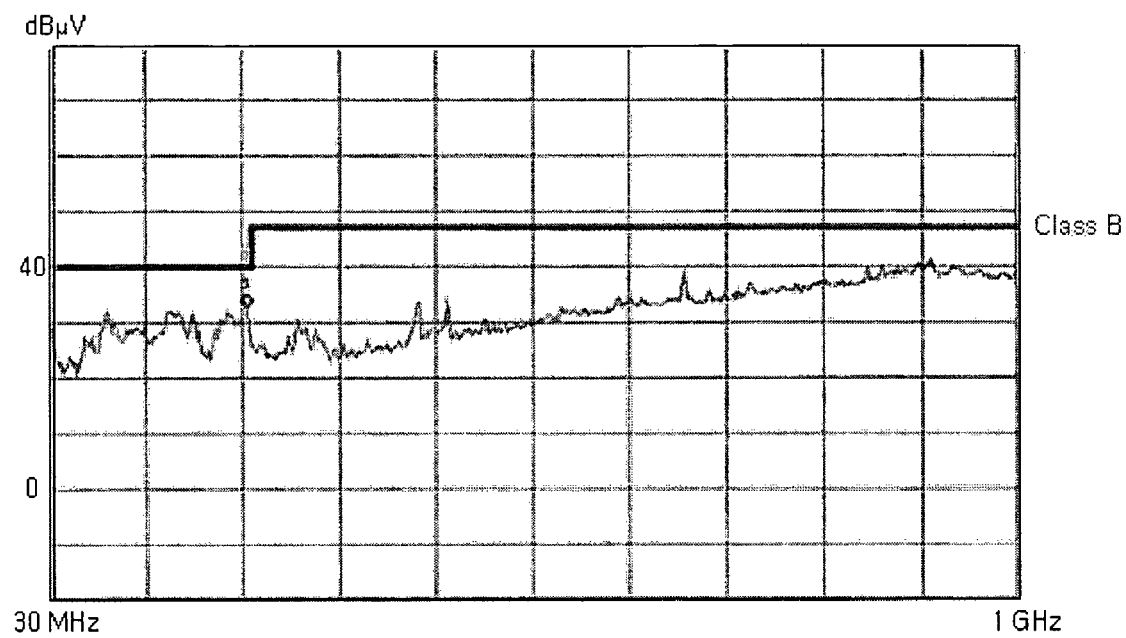
FIG. 8b is a graph illustrating an electromagnetic interference emission measured in the horizontal direction in case where a PDP filter manufactured according to the present invention is mounted on a PDP module.

The cut PDP filter was mounted on a PDP module (LG Electronics V5 module), and a conductive tape was adhered to the left and right sides on which an etched surface was not exposed, and then each electromagnetic interference emission was measured vertically and horizontally to obtain a result as illustrated in FIGS. 8a and 8b.

COMPARATIVE EXPERIMENTAL EXAMPLE

Figure 1:
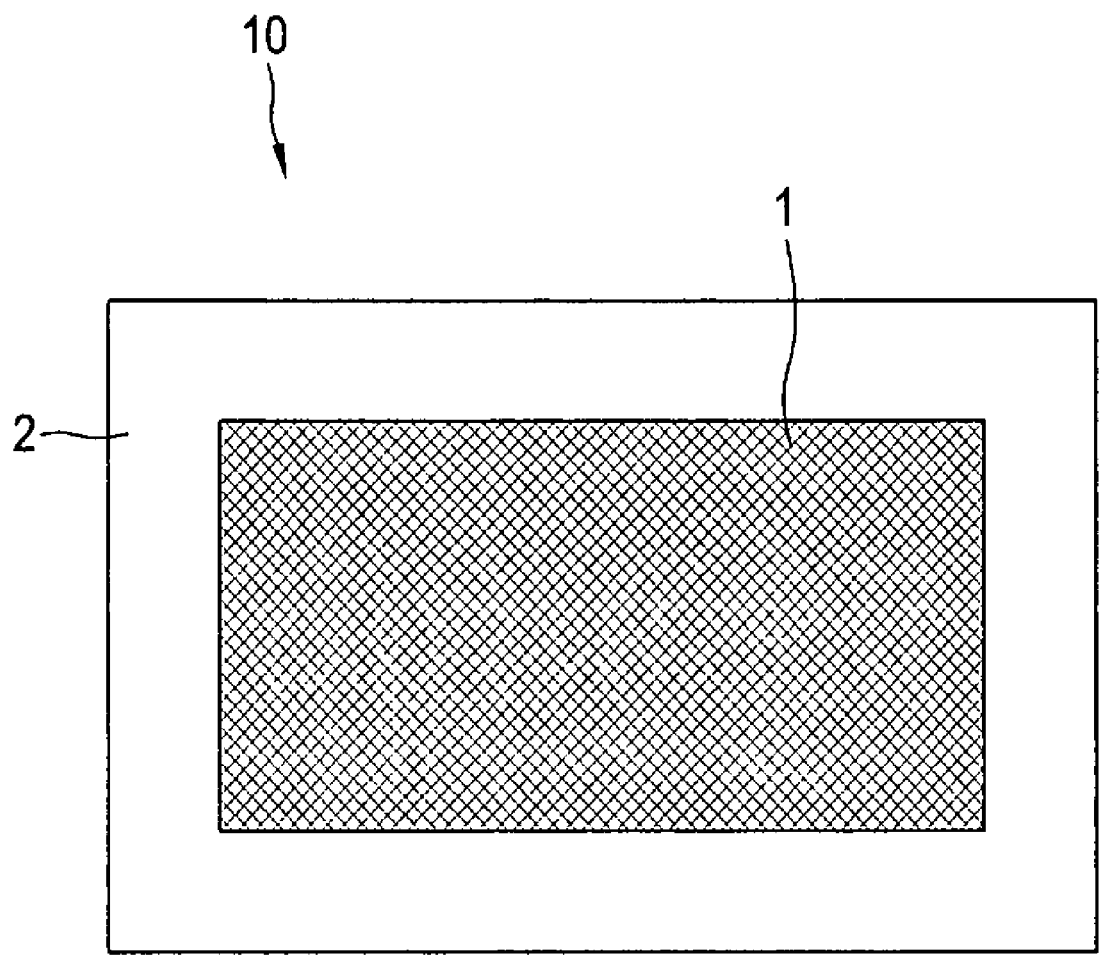
FIG. 1 is a view illustrating a configuration of an electromagnetic interference film in the prior art.
Figure 2:
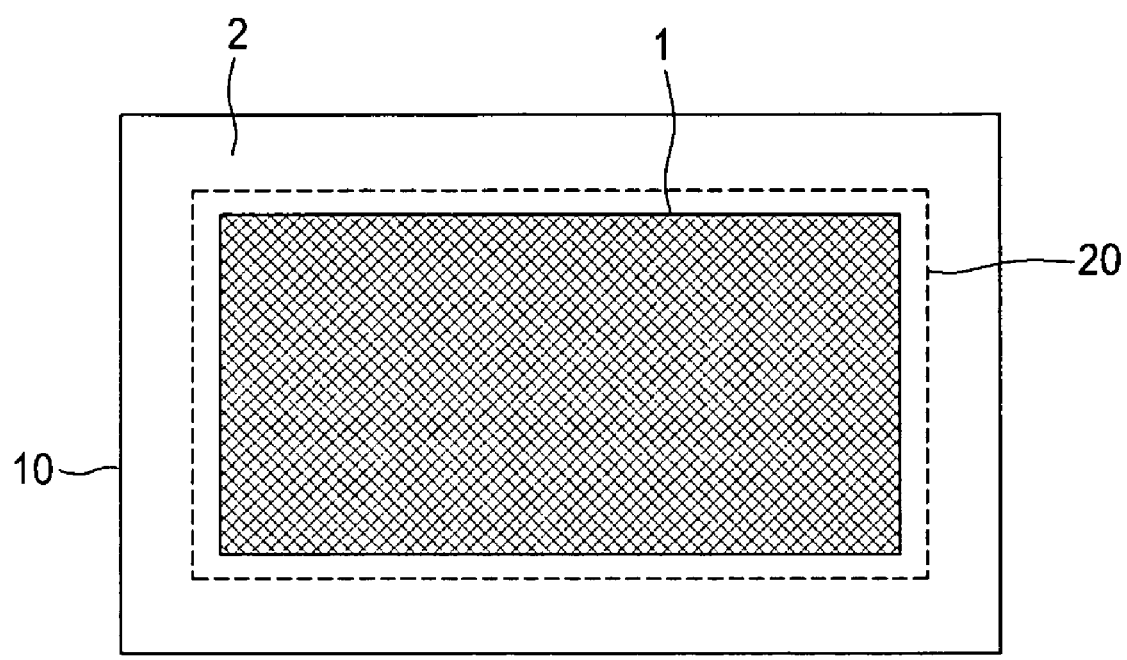
FIG. 2 is a plan view illustrating a PDP filter in the prior art.
Figure 9A:
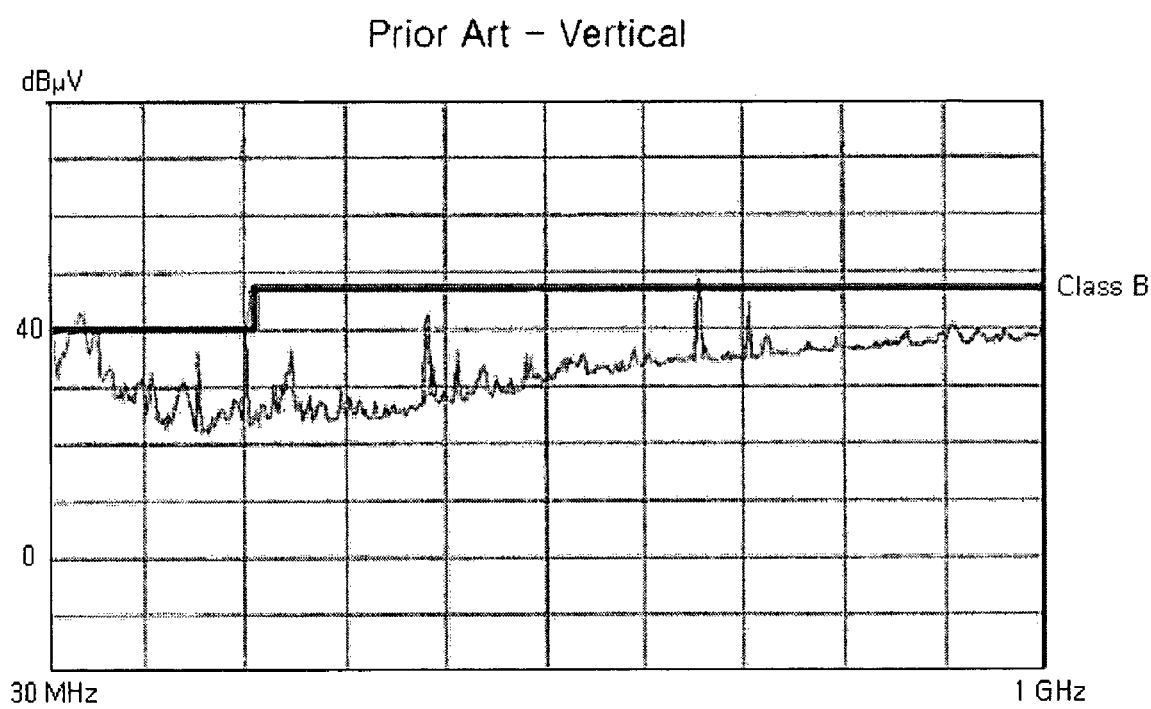
FIG. 9a is a graph illustrating an electromagnetic interference emission measured in the vertical direction in case where a PDP filter manufactured according in the prior art is mounted on a PDP module.
Figure 9B:
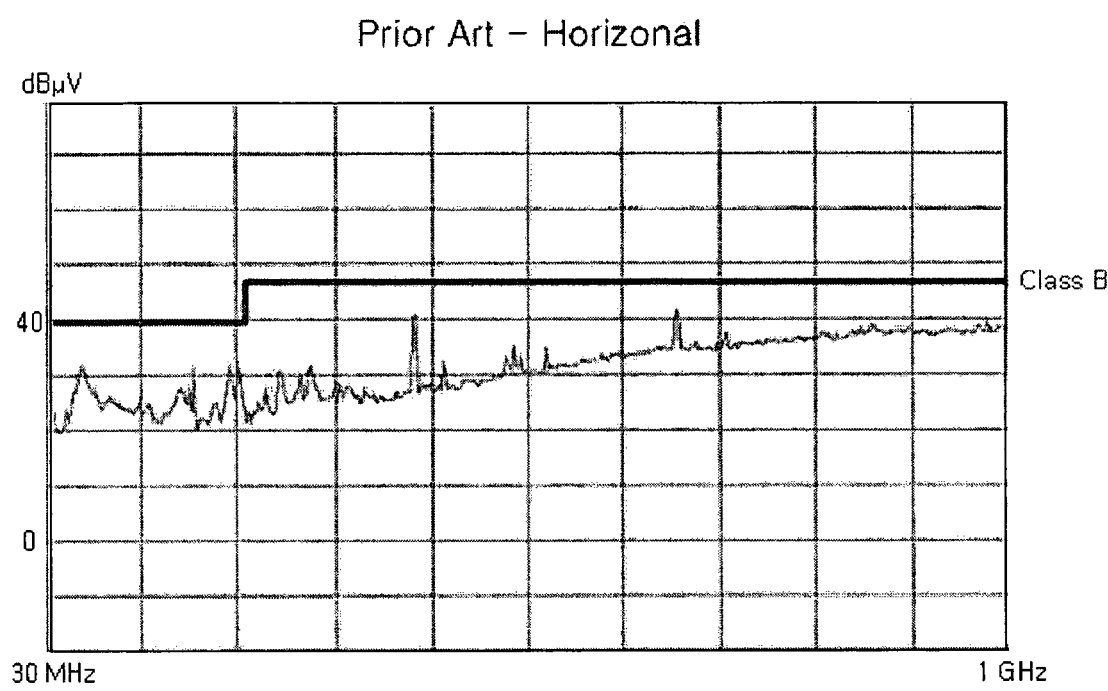
FIG. 9b is a graph illustrating an electromagnetic interference emission measured in the horizontal direction in case where a PDP filter manufactured in the prior art is mounted on a PDP module.

As illustrated in FIG. 2, a PDP filter in which an anti-reflection film was adhered in such a manner that the ground portions exist at the four end sides of the electromagnetic interference film was mounted on the same PDP module in the abovementioned Experimental Example, and then each electromagnetic interference emission was measured vertically and horizontally to obtain a result as illustrated in FIGS. 9a and 9b.

Through the Experimental Example and Comparative Experimental Example, it was confirmed that a PDP filter according to the present invention satisfied the electromagnetic interference standard Class B as a conventional PDP filter in which the etching portion was separated from the non-etching portion.

While the present invention has been described and illustrated herein with reference to the preferred embodiment thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

INDUSTRIAL APPLICABILITY

According to the present invention, it has an effect of making mass production possible to improve the productivity on a far larger scale since an electromagnetic interference film and a functional film are adhered using a roll-to-roll process compared to being adhered one by one in a sheet state. Moreover, it has an effect of applying to various kinds of PDPs by cutting into a desired size since the non-etching portion corresponding to the ground portion in a structure of the existing product is removed.

Furthermore, according to the present invention, it can be used by cutting an electromagnetic interference film and a functional film only at a state of being adhered to each other in a roll shape to directly attach to a PDP module, or can be used by attaching an electromagnetic interference film and a functional film to a tempered glass at a state of being adhered to each other in a roll shape to finish a general glass filter.

Moreover, according to the present invention, it has an effect of securing the reliability of a PDP filter by providing a more convenient manufacturing method as well as making the ground and the electromagnetic interference shielding at the same level as in the prior art.

The invention claimed is:

1. A PDP filter comprising an electromagnetic interference film and at least one functional film which are laminated with each other, wherein the electromagnetic interference film is etched on an entire surface so as to expand a region made of an effective screen portion into the entire surface of the electromagnetic interference film,
wherein a width of the functional film is less than a width of the electromagnetic interference film, such that only upper and lower ends of a top surface of the electromagnetic interference film are exposed to make a ground, the functional film being laminated on the top surface of the electromagnetic interference film.

2. The PDP filter according to claim 1, wherein a conductive tape for the ground is adhered to a left end or right end or both the left and the right end of the top surface of the electromagnetic interference film, the left end and the right end not being exposed.

3. The PDP filter according to claim 1, wherein a conductive paste for the ground is coated on a left end or right end or both the left and the right end of the top surface of the electromagnetic interference film, the left end and the right end not being exposed.

4. The PDP filter according to claim 1, wherein the functional film is at least one or more of anti-reflective film, near infrared ray shielding film, ultraviolet ray shielding film, color correction film, impact absorption film, glare-proof film, and noise absorption film.

* * * * *